(12) United States Patent
McNeil, Jr. et al.

(10) Patent No.: US 9,495,250 B2
(45) Date of Patent: Nov. 15, 2016

(54) PROVIDING CODE TO A PROGRAMMABLE DEVICE

(75) Inventors: Roy C. McNeil, Jr., Warwick, NY (US); David W. Terwilliger, Garland, TX (US)

(73) Assignee: Fujitsu Limited, Kawasaki (JP)

( * ) Notice: Subject to any disclaimer, the term of this patent is extended or adjusted under 35 U.S.C. 154(b) by 2199 days.

(21) Appl. No.: 12/480,830

(22) Filed: Jun. 9, 2009

(65) Prior Publication Data

US 2010/0058311 A1 Mar. 4, 2010

Related U.S. Application Data

(60) Provisional application No. 61/093,602, filed on Sep. 2, 2008.

(51) Int. Cl.
| | |
|---|---|
| *G06F 9/44* | (2006.01) |
| *H03M 13/09* | (2006.01) |
| *G06F 12/02* | (2006.01) |
| *G06F 12/16* | (2006.01) |
| *G06F 11/14* | (2006.01) |
| *G06F 9/445* | (2006.01) |

(52) U.S. Cl.
CPC ............ *G06F 11/1433* (2013.01); *G06F 9/44* (2013.01); *G06F 9/445* (2013.01); *G06F 9/44536* (2013.01); *G06F 12/02* (2013.01); *G06F 12/16* (2013.01); *H03M 13/09* (2013.01)

(58) Field of Classification Search
None
See application file for complete search history.

(56) References Cited

U.S. PATENT DOCUMENTS

| | | | | |
|---|---|---|---|---|
| 6,351,452 B1 * | 2/2002 | Koenig | .................. | H04Q 1/028 370/217 |
| 6,438,065 B1 * | 8/2002 | Rao | ........................ | G11C 16/08 365/185.14 |
| 6,643,506 B1 * | 11/2003 | Criss | ......................... | G06F 8/65 455/418 |
| 6,832,323 B1 * | 12/2004 | Booth | .................. | H04N 21/235 348/E5.006 |
| 6,851,015 B2 * | 2/2005 | Akahane | .............. | G11C 16/105 365/228 |
| 7,003,679 B1 | 2/2006 | Lesea et al. | .................. | 713/300 |
| 7,065,560 B2 * | 6/2006 | Erickson | .................... | G06F 8/71 709/219 |
| 7,321,900 B1 * | 1/2008 | Karun et al. | | |
| 7,391,237 B2 | 6/2008 | Fang et al. | ....................... | 326/46 |
| 7,573,292 B1 * | 8/2009 | Chan | ................ | H03K 19/17732 326/38 |
| 7,589,362 B1 * | 9/2009 | Argyres | ................ | H01L 23/585 257/208 |
| 7,664,834 B2 * | 2/2010 | Keith, Jr. | .............. | G06F 9/4416 709/220 |

(Continued)

FOREIGN PATENT DOCUMENTS

| | | | |
|---|---|---|---|
| CN | 101631037 B | * | 9/2011 |
| KR | 100811109 B1 | * | 3/2008 |

OTHER PUBLICATIONS

'Secure FPGA Configuration Architecture Preventing System Downgrade' by Badrignans et al., International Conference on Field Programmable Logic and Applications, Sep. 8-10, 2008.*

(Continued)

*Primary Examiner* — Steven Snyder
(74) *Attorney, Agent, or Firm* — Baker Botts L.L.P.

(57) ABSTRACT

According to one embodiment, providing a bitstream to one or more programmable devices of a service unit card includes receiving the bitstream at a snooper of the service unit card. The snooper determines whether the bitstream is current. If the bitstream is current, the bitstream is loaded onto the programmable devices. If the bitstream is not current, the received bitstream is discarded, and a substitute bitstream is identified. The substitute bitstream is loaded onto the programmable devices.

22 Claims, 2 Drawing Sheets

(56) References Cited

U.S. PATENT DOCUMENTS

| | | | | |
|---|---|---|---|---|
| 7,716,497 | B1* | 5/2010 | Trimberger | G06F 21/62 365/186 |
| 7,756,906 | B2* | 7/2010 | Mehta et al. | 707/803 |
| 7,870,548 | B2* | 1/2011 | Chu Chen | G06F 11/1417 717/168 |
| 7,984,323 | B2* | 7/2011 | Bass | G06F 11/1433 714/4.11 |
| 8,166,285 | B2* | 4/2012 | Lee | G06F 8/65 713/1 |
| 8,468,515 | B2* | 6/2013 | Chen | G06F 8/65 713/1 |
| 2002/0099726 | A1* | 7/2002 | Crudele | G06F 8/68 |
| 2002/0169825 | A1* | 11/2002 | Hougland et al. | 709/203 |
| 2003/0154471 | A1* | 8/2003 | Teachman | G06F 9/4401 717/171 |
| 2003/0182414 | A1* | 9/2003 | O'Neill | G06F 8/65 709/223 |
| 2004/0049609 | A1* | 3/2004 | Simonson | G06F 9/541 710/8 |
| 2005/0010916 | A1* | 1/2005 | Hagen | G06F 8/65 717/170 |
| 2005/0273781 | A1* | 12/2005 | Nakamura | G06F 8/60 717/178 |
| 2006/0002520 | A1* | 1/2006 | Bettis et al. | 379/88.17 |
| 2006/0117310 | A1* | 6/2006 | Daniels | G06F 8/68 717/168 |
| 2006/0277524 | A1* | 12/2006 | Goodman | G06F 8/65 717/106 |
| 2007/0055969 | A1* | 3/2007 | Yang | G06F 11/1433 717/168 |
| 2008/0098002 | A1* | 4/2008 | Mehta et al. | 707/10 |
| 2008/0098164 | A1* | 4/2008 | Lee et al. | 711/103 |
| 2008/0098186 | A1* | 4/2008 | Zhou et al. | 711/159 |
| 2009/0089797 | A1* | 4/2009 | Kukreja et al. | 719/314 |
| 2010/0058042 | A1* | 3/2010 | Locker | G06F 9/4416 713/2 |

OTHER PUBLICATIONS

'A Protocol for Secure Remote Updates of FPGA Configurations' by Saar Drimer and Markus G. Kuhn, copyright 2009 by Springer-Verlag Berlin Heidelberg.*
'A Tutorial on VHDL Synthesis, Place and Route for FPGA and ASIC Technologies' by Anup Gangwar, Oct. 4, 2004.*
'Garp: A MIPS Processor with a Reconfigurable Coprocessor' by John R. Hauser and John Wawrzynek, copyright 1997 by IEEE.*
'Yards: FPGA/MPU Hybrid Architecture for Telecommunication Data Processing' by Akihiro Tsutsui and Toshiaki Miyazaki, copyright 1997, ACM.*
'CSU/DSU (Channel Service Unit/Data Service Unit)' by Margaret Rose on Whatis.com from Oct. 2008.*

* cited by examiner

PROVIDING CODE TO A PROGRAMMABLE DEVICE

RELATED APPLICATION

This application claims benefit under 35 U.S.C. §119(e) of U.S. Provisional Application Ser. No. 61/093,602, entitled "System and Method for Substituting a Software Load Bitstream,"0 filed Sep. 2, 2008, by Roy McNeil.

TECHNICAL FIELD

This invention relates generally to the field of programmable devices and more specifically to providing code to a programmable device.

BACKGROUND

Service unit cards may have devices that are loaded with software from a master controller. For example, a telecommunication node may have a shelf with a number of cards. A controller card may download software to be loaded onto programmable devices on other cards of the shelf.

SUMMARY OF THE DISCLOSURE

In accordance with the present invention, disadvantages and problems associated with previous techniques for providing code to a programmable device may be reduced or eliminated.

According to one embodiment, providing a bitstream to one or more programmable devices of a service unit card includes receiving the bitstream at a snooper of the service unit card. The snooper determines whether the bitstream is current. If the bitstream is current, the bitstream is loaded onto the programmable devices. If the bitstream is not current, the received bitstream is discarded, and a substitute bitstream is identified. The substitute bitstream is loaded onto the programmable devices.

According to one embodiment, providing code to a service unit card includes determining, by a loader of the service unit card, whether downloaded code is current. If the downloaded code is current, the loader instructs a processor to execute the downloaded code stored in a memory of the card. If the downloaded code is not current, the loader instructs the processor to execute substitute code stored in other memories of the card.

Certain embodiments of the invention may provide one or more technical advantages. A technical advantage of one embodiment may be that an updated bitstream may be automatically substituted for an outdated bitstream downloaded from a master controller. The updated bitstream may be loaded onto a programmable device of a service unit card. A technical advantage of another embodiment may be that a processor of a service unit card may be instructed to execute updated code stored in a memory instead of outdated code downloaded from a master controller.

In the embodiments, software stored at the master controller may remain unchanged. Accordingly, the embodiments may allow for replacing service unit cards without updating the master controller. The embodiments may allow a service unit card to replace an existing card in order to provide replacement, updated, or different capabilities without affecting the customer. The embodiments may store the updated code on memory that is larger than that of the master controller, which may allow for larger updated code.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
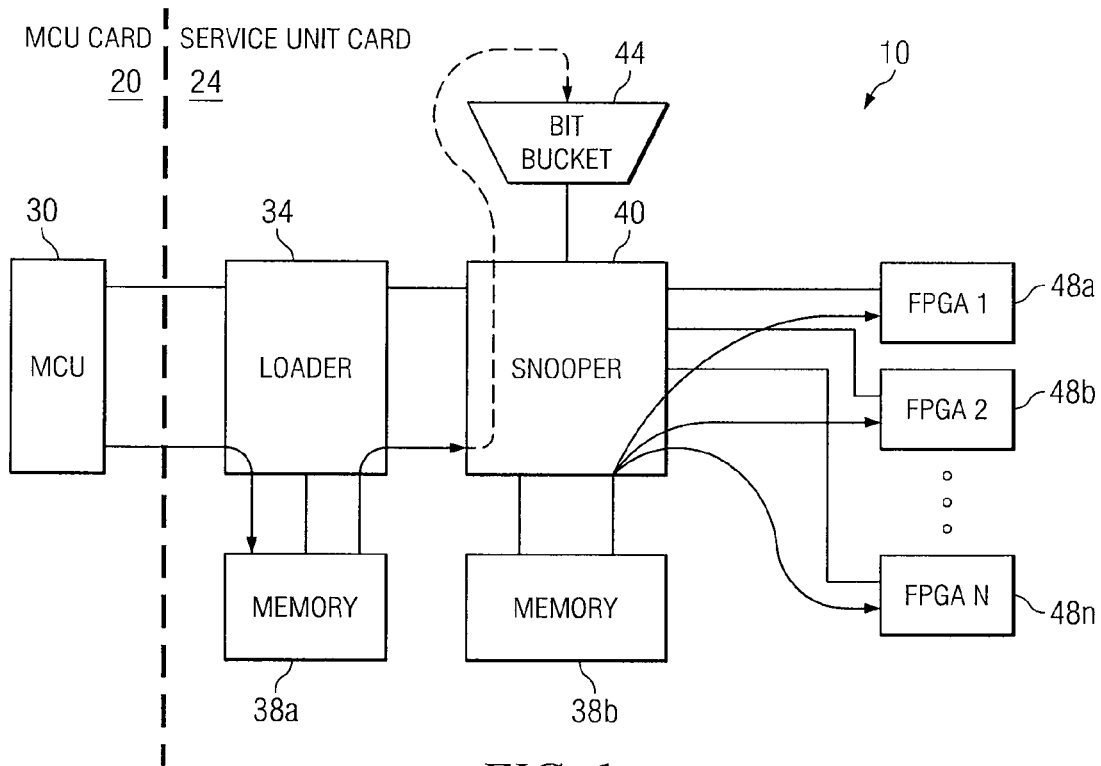
FIG. 1 illustrates an embodiment of a system for providing a bitstream to a programmable device.
Figure 3:
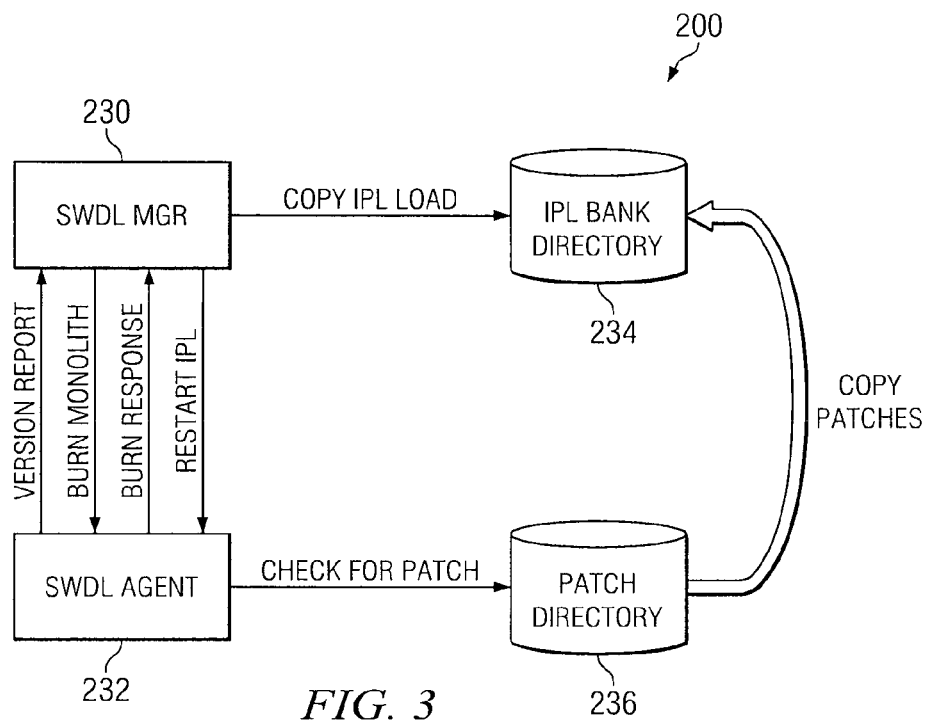
FIG. 3 illustrates an embodiment of system for patching software.
Figure 2:
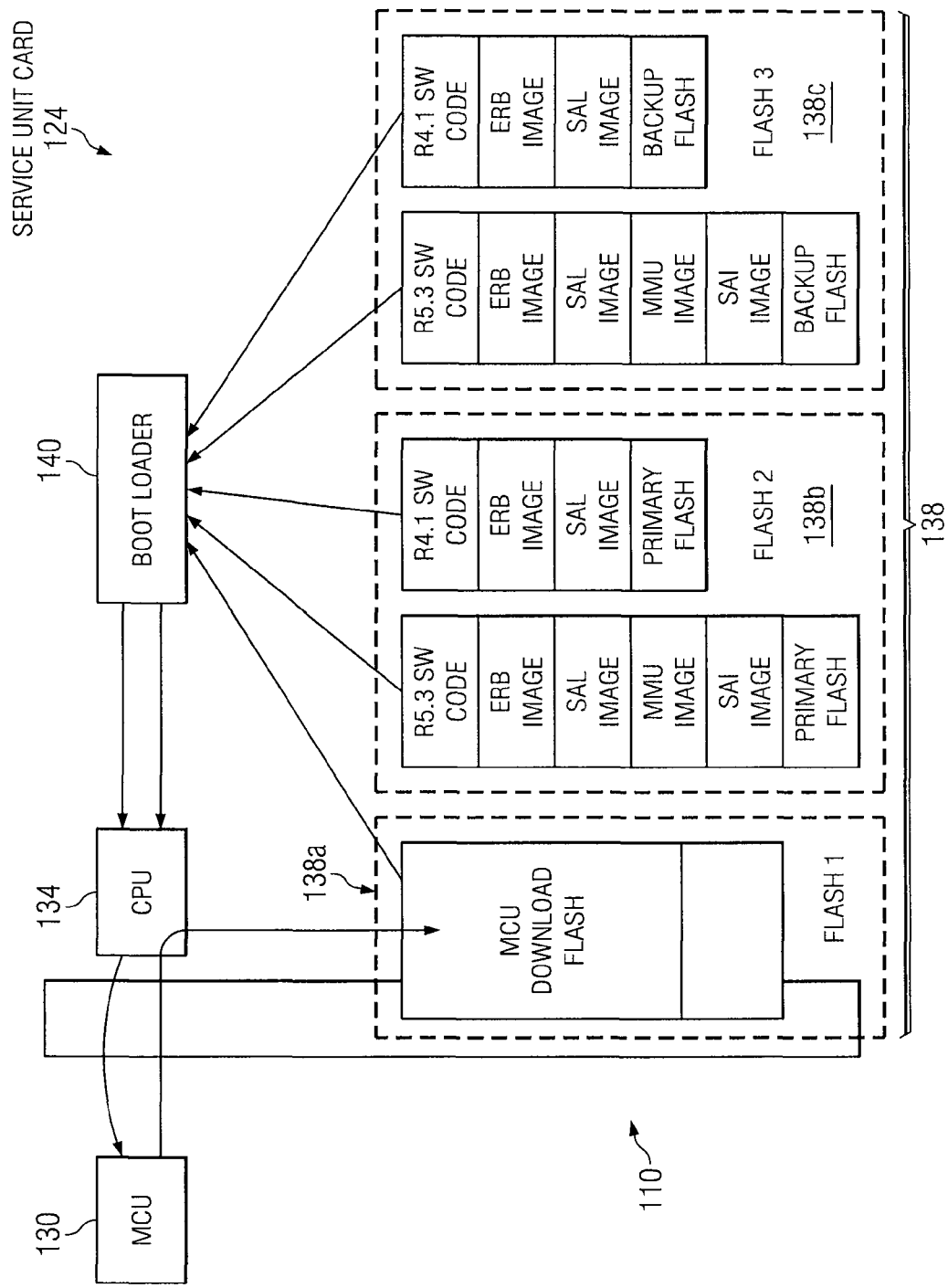
FIG. 2 illustrates an embodiment of a system for providing code to a service unit card.

Embodiments of the present invention and its advantages are best understood by referring to FIGS. 1 through 3 of the drawings, like numerals being used for like and corresponding parts of the various drawings.

FIG. 1 illustrates an embodiment of a system 10 for providing a bitstream to a programmable device. In the illustrated embodiment, system 10 includes a master controller unit (MCU) card 20 and a service unit card 24. MCU card 20 includes an MCU 30. Service unit card 24 includes a loader 34, one or more memories 38(a and/or b), a snooper 40, a bit bucket 44, and one or more programmable devices, such as field programmable gate arrays (FPGAs) 48(a, b, . . . and/or n). In other embodiments, MCU 30 may be located on service unit card 24. The components of system 10 may be located at a shelf of a telecommunications node.

MCU 30 may represent any suitable master controller that controls a slave device, such as service unit cards. In certain embodiments, MCU 30 of MCU card 20 controls one or more service unit cards 24. A service unit card 24 may perform telecommunications operations. Examples of service unit cards 24 include Digital Signal 1 (DS1), Ethernet, Frame Relay, or optical line cards.

In certain embodiments, service unit card 24 may provide replacement, upgraded, or different capabilities to a telecommunications node. That is, service unit card 24 may replace inoperable devices, outdated devices, or devices with different capabilities. For example, RPR, APORT, and EPORT capabilities, may be provided on QLAN2, GLAN2, and FLAN2 cards.

Loader 34 downloads a bitstream from MCU 30. Memory 38 may comprise any suitable memory, such as flash memory. Other examples of memory are discussed below. Memory 38 may be configured to store code. In certain embodiments, "code" may refer to a series of characters written according to a programming language that may be executed by a computing device. Examples of code include software and bitstreams.

In certain embodiments, memory 38a stores code downloaded from MCU 30, memory 38b stores substitute code that may be pre-compiled and that programmable devices 48 may use. In certain embodiments, memory 38b may be loaded with the substitute bitstream before the card is shipped. In certain embodiments, memories 38 may comprise a primary memory and a backup memory. The primary memory stores primary substitute code, and the backup memory stores backup substitute code that may be used if the primary substitute code is not available.

A substitute bitstream may be the result of any suitable situation. In particular embodiments, a new bitstream may be the result of using a new device, such as a new cost-reduced or a higher performance FPGA. The new FPGA may be transparent to the end customer. In other embodiments, a new bitstream may be the result of using a device (such as an FPGA) that includes an update for fixing latent bugs.

FPGAs 48 are examples of programmable devices that can execute code to perform operations. Other examples of programmable devices include application-specific integrated circuit (ASICs), complex programmable logic devices (CPLDs), central processing units (CPUs), controllers, digital signal processors, or other computing devices.

Snooper 40 provides substitute bitstreams to FPGAs 48, if needed. In certain embodiments, snooper 40 receives a bitstream from memory 38a during, for example, initialization, or power up. Snooper 40 determines whether the bitstream is current. Snooper 40 may examine a cyclic redundancy check (CRC) block to determine whether the bitstream is current. In certain embodiments, if a device revision level of a device is more current than a bitstream revision level of the bitstream, then bitstream may be regarded as not current.

If the bitstream is current, snooper 40 loads the bitstream onto the one or more devices. If the bitstream is not current, snooper 40 discards the received bitstream at, for example, bit bucket 44. Snooper 40 then identifies a substitute bitstream stored in memory 38b and loads the substitute bitstream onto FPGAs 48.

FIG. 2 illustrates an embodiment of a system 110 for providing code to a service unit card 124. In the illustrated embodiment, system 110 includes an MCU 130 and service unit card 124. MCU 130 may be located on service unit card 124 or may be separate from service unit card 124. Service unit card 124 includes a CPU 134, memories 138(a, b, and/or c), and a loader 140 coupled as shown. MCU 130 and memories 138 may be substantially similar to MCU 30 and memories 38 of FIG. 1.

In certain embodiments, CPU 134 enters an initialization state and loads loader 140 onto service unit card 124 in response to entering the initialization state.

In certain embodiments, loader 140 determines whether downloaded code stored in memory 138a is current. Loader 140 may determine whether code is current in a manner similar to that used by snooper 40 to determine whether a bitstream is current. If the downloaded code is current, loader 140 instructs CPU 134 to execute the downloaded code stored in memory 138a. For example, loader 140 may instruct CPU 134 to retrieve code FPGA images from memory 138a.

If the downloaded code is not current, loader 140 instructs CPU 134 to execute substitute code stored in primary memory 138b (or secondary memory 138c if primary memory 138b is unavailable). For example, loader 140 may instruct processor 134 to retrieve code FPGA images from memory 138b (or 138c).

FIG. 3 illustrates an embodiment of system 200 for patching software. In the illustrated embodiment, system 200 includes a software download (SWDL) manager 230, a software download agent 232, a bank directory 234, and a patch directory 236.

In certain embodiments, patch directory 236 stores software patch load modules and a monolith. The patches may be installed on patch directory 236 during the manufacturing process. Software download agent 232 receives a command to burn an initial program load. Software download agent 232 determines if there is a module to be patched according to the patch configuration file of patch directory 236. Software download agent 232 then updates bank directory 234 to reflect the patch modules. Software download agent 232 then burns the patched monolith and informs software download manager 232 that the monolith has been patched.

A component of the systems may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Modifications, additions, or omissions may be made to the systems without departing from the scope of the invention. The components of the systems may be integrated or separated. Moreover, the operations of the systems may be performed by more, fewer, or other components. For example, the operations of loader 34 and snooper 40 may be performed by one component, or the operations of snooper 40 may be performed by more than one component. Additionally, operations of the systems may be performed using any suitable logic comprising software, hardware, and/or other logic. As used in this document, "each" refers to each member of a set or each member of a subset of a set.

Modifications, additions, or omissions may be made to the methods without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method comprising:
  receiving, at a snooper of a service unit card, a bitstream, the received bitstream being for loading onto one or more programmable devices of the service unit card;
  determining whether the received bitstream is current;
  if the received bitstream is current, loading the received bitstream onto the one or more programmable devices; and
  if the received bitstream is not current:
    discarding the received bitstream;
    identifying a substitute bitstream stored in a memory of the service unit card, the substitute bitstream being different than the received bitstream; and
    loading the substitute bitstream onto the one or more programmable devices.

2. The method of claim 1, the substitute bitstream being pre-compiled.

3. The method of claim 1, the receiving, at the snooper of a service unit card, the bitstream further comprising:
  receiving the bitstream from a master controller unit.

4. The method of claim 1, the determining whether the received bitstream is current further comprising:
  examining a cyclic redundancy check (CRC) block to determine whether the received bitstream is current.

5. The method of claim 1, the determining whether the received bitstream is current further comprising:
  determining that the received bitstream is not current if a device revision level of the one or more programmable devices is more current than a bitstream revision level of the received bitstream.

6. An apparatus comprising:
  one or more memories, each memory configured to store a substitute bitstream;
  one or more programmable devices; and
  a snooper of a service unit card configured to:
    receive a bitstream for loading onto the one or more programmable devices;
    determine whether the received bitstream is current;
    if the received bitstream is current, load the received bitstream onto the one or more programmable devices; and
    if the received bitstream is not current:
      discard the received bitstream;
      identify a substitute bitstream stored in a memory of the service unit card, wherein the substitute bitstream is different than the received bitstream; and
      load the substitute bitstream onto the one or more programmable devices.

7. The apparatus of claim 6, the substitute bitstream being pre-compiled.

8. The apparatus of claim 6, the snooper configured to receive the bitstream by:
  receiving the bitstream from a master controller unit.

9. The apparatus of claim 6, the snooper configured to determine whether the received bitstream is current by:
  examining a cyclic redundancy check (CRC) block to determine whether the received bitstream is current.

10. The apparatus of claim 6, the snooper configured to determine whether the received bitstream is current by:
  determining that the received bitstream is not current if a device revision level of the one or more programmable devices is more current than a bitstream revision level of the received bitstream.

11. The apparatus of claim 6, further comprising: a master controller unit configured to provide the bitstream to the snooper.

12. A method comprising:
  determining, by a loader of a service unit card, whether downloaded code is current, the downloaded code stored in a first memory of a plurality of memories of the service unit card;
  if the downloaded code is current, instructing a processor to execute the downloaded code stored in the first memory; and
  if the downloaded code is not current, instructing the processor to execute substitute code stored in one or more other memories of the plurality of memories, the substitute code being different than the downloaded code.

13. The method of claim 12, the one or more other memories comprising one or more flash memories.

14. The method of claim 12, further comprising:
  entering, by the processor, an initialization state; and
  loading, by the processor, the loader in response to entering the initialization state.

15. The method of claim 12, the one or more other memories comprising a primary memory and a backup memory.

16. The method of claim 12, the instructing the processor to execute substitute code stored in one or more other memories of the plurality of memories further comprising:
  instructing the processor to retrieve a field programmable gate array (FPGA) image from the one or more other memories.

17. An apparatus comprising:
  a plurality of memories comprising:
    a first memory configured to store downloaded code; and
    one or more other memories configured to store substitute code, wherein the substitute code is different than the downloaded code;
  a processor configured to execute code; and
  a loader of a service card configured to:
    determine whether the downloaded code is current;
    if the downloaded code is current, instruct the processor to execute the downloaded code; and
    if the downloaded code is not current, instruct the processor to execute the substitute code.

18. The apparatus of claim 17, the one or more other memories comprising one or more flash memories.

19. The apparatus of claim 17, the processor configured to:
  enter an initialization state; and
  load the loader in response to entering the initialization state.

20. The apparatus of claim 17, the one or more other memories comprising a primary memory and a backup memory.

21. The apparatus of claim 17, the loader configured to instruct the processor to execute substitute code by:
  instructing the processor to retrieve a field programmable gate array (FPGA) image from the one or more other memories.

22. The apparatus of claim 17, further comprising:
  a master controller unit configured to provide the downloaded code.

* * * * *